United States Patent [19]

Hinn

[11] 4,096,517
[45] Jun. 20, 1978

[54] VIDEO AMPLIFIER

[75] Inventor: Werner Hinn, Zollikerberg, Switzerland

[73] Assignee: RCA Corporation, New York, N.Y.

[21] Appl. No.: 789,656

[22] Filed: Apr. 21, 1977

Related U.S. Application Data

[63] Continuation of Ser. No. 688,408, May 20, 1976.

[30] Foreign Application Priority Data

Nov. 25, 1975 United Kingdom ............... 48352/75

[51] Int. Cl.² ............................................. H04N 9/537
[52] U.S. Cl. ..................................... 358/40; 330/291; 330/296; 330/98
[58] Field of Search .......................... 358/40, 27, 184; 330/16, 17, 19, 20, 97, 98, 18

[56] References Cited

U.S. PATENT DOCUMENTS

| | | | |
|---|---|---|---|
| 3,499,104 | 3/1970 | Austin | 358/40 |
| 3,668,540 | 6/1972 | Camenzind | 330/18 |

Primary Examiner—Richard Murray
Attorney, Agent, or Firm—Eugene M. Whitacre; Kenneth R. Schaefer; Ronald H. Kurdyla

[57] ABSTRACT

A wide bandwidth, low power dissipation, cascode video output amplifier suitable for driving an in-line gun color picture tube or the like. The cascode amplifier includes a low voltage, small signal, common emitter amplifier transistor and a high voltage common base transistor. An active load circuit comprising a transistor of like conductivity with respect to the common base and common emitter transistors is coupled between the collector of the common base stage and a source of operating voltage. A disconnect diode, interposed between the emitter of the load transistor and the collector of the common base transistor, is based to a non-conductive state under quiescent conditions. Voltage dependent current feedback is provided from the emitter of the load transistor to the base of the common emitter transistor. Operating current for the cascode arrangement is provided via a resistor coupled from the operating voltage source to the base of the load transistor and the collector of the common base transistor.

6 Claims, 1 Drawing Figure

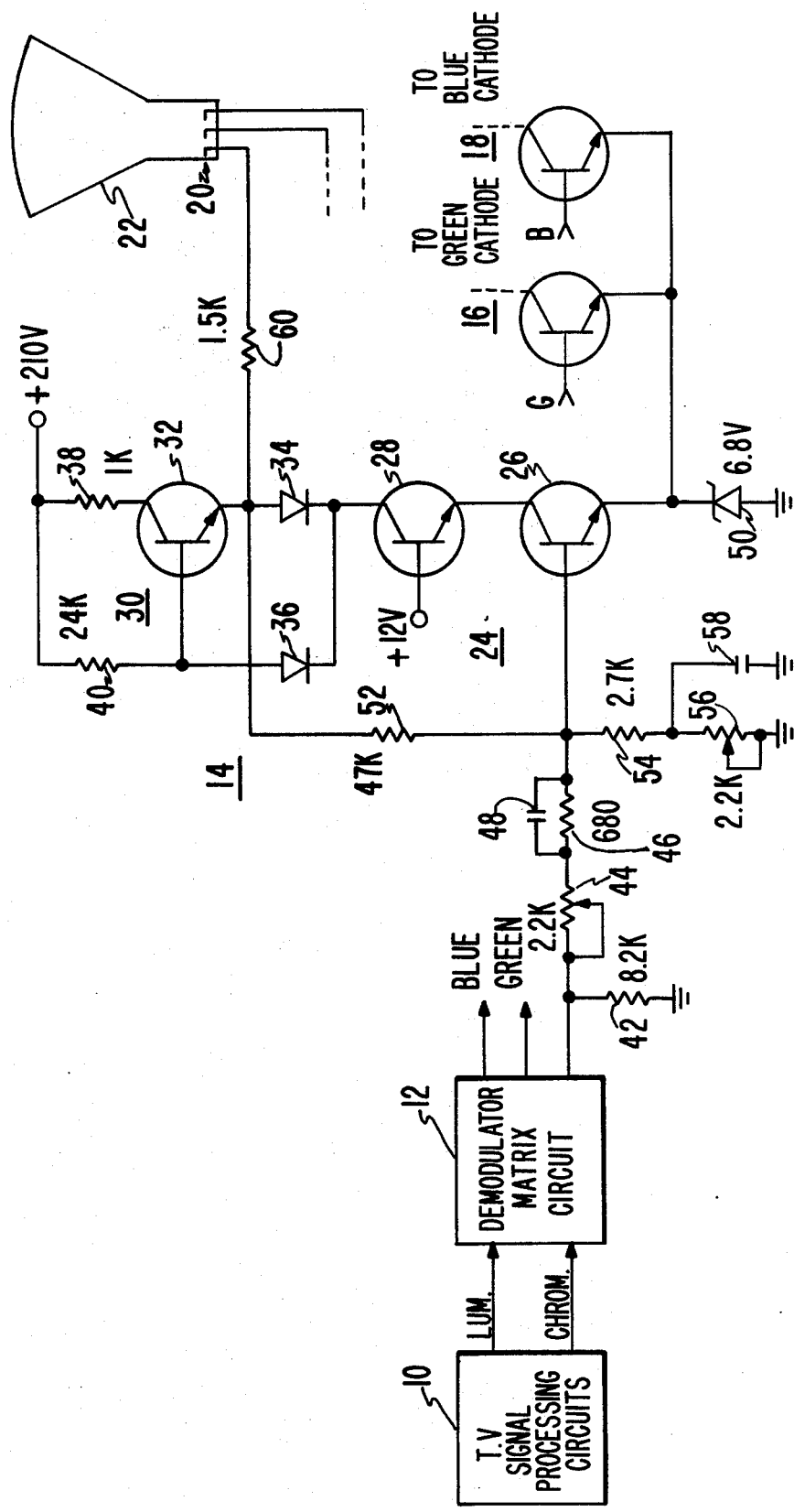

VIDEO AMPLIFIER

This is a continuation of application Ser. No. 688,408, filed May 20, 1976.

This invention relates to video amplifier circuits and, in particular, to wide bandwidth, low power dissipation, cascode video output stages suitable for driving a color picture tube.

Various cascode video output amplifiers are known (see for example, U.S. Pat. Nos. 3,499,104 — Austin; 3,598,312 — Nillesen and 3,823,264 — Haferl). The cascode arrangement typically includes a low voltage, high current gain, common emitter device coupled to a high voltage, unity current gain, common base device. The common base device isolates the collector of the low voltage device from load voltage variations, thereby minimizing Miller multiplication of collected-base capacitance of the low voltage device. Furthermore, as is known, there is no Miller effect multiplication of the collector-base capacitance of the common base stage. Thus, the effect on amplifier bandwidth of the collector-base capacitances of the active devices is less in the cascode arrangement than in, for example, a common emitter amplifier.

Cascode video amplifiers therefore are capable of providing a wide bandwidth. However, cascode amplifiers typically are biased for Class A or AB operation, conditions which involve undesirable power dissipation. It is desirable to minimize power dissipation of video output devices, since those devices which exhibit the lowest basecollector capacitance (and hence are capable of providing wide bandwidth) typically exhibit a high thermal resistance (i.e., a large change in temperature as a function of dissipation). Such temperature changes result in undesired drift of amplifier operating conditions. Heat sinks may be used to aid in the removal of heat from the output stage devices to avoid such drift. However, the heat sink itself will increase the effective collector capacitance of the device(s) and thereby diminish the wide bandwidth capability of the amplifier. Thus, in addition to the direct benefits of conserving power and avoiding thermal drift of operating characteristics, it is also desirable from the standpoint of achievable bandwidth to minimize power dissipation in video output devices. This is particularly true in the case where the amplifier is used to drive an "in-line" gun cathode ray tube, which device requires operation with a relatively high direct supply voltage (e.g., of the order of two hundred volts), since the dissipation and thermal drift otherwise may be considerable in that case.

In accordance with the present invention, a wide bandwidth, low power dissipation, cascode video output amplifier suitable for driving an in-line gun color picture tube or the like comprises a cascode signal amplifier. The cascode amplifier includes a low voltage, small signal, common emitter amplifier transistor and a high voltage common base transistor. An active load circuit comprising a transistor of like conductivity with respect to the common base and common emitter transistors is coupled between the collector of the common base stage and a source of operating voltage. A disconnect diode, interposed between the emitter of the load transistor and the collector of the common base transistor, is biased to a non-conductive state under quiescent conditions. Voltage dependent current feedback is provided from the emitter of the load transistor to the base of the common emitter transistor. Operating current for the cascode arrangement is provided via a resistor coupled from the operating voltage source to the base of the load transistor and the collector of the common base transistor.

Referring to the embodiment of the invention shown in the drawing, television signal processing circuits 10 including, for example, a video detector, provide luminance and chrominance signal components to a demodulator-matrix circuit 12 which, in turn, provides color video signals (e.g., red, green and blue image-representative signals) to respective video amplifier circuits 14, 16, 18 (the latter two being partially shown). Amplified video output signals are supplied from each of the amplifier circuits 14, 16, 18 to respective control (e.g., cathode) electrodes 20 of a color image reproducing cathode ray tube 22 of, for example, the in-line gun type.

Since amplifiers 14, 16 and 18 are substantially identical, only amplifier 14 is shown and will be described in detail. Amplifier 14 comprises a cascode arrangement 24 of a common emitter transistor 26 and a common base transistor 28. The emitter of the common emitter transistor 26 (as well as the corresponding electrodes of amplifiers 16 and 18) is coupled to a point of reference voltage (e.g., +6.8 volts provided by a zener diode 50 in the figure).

The base of common emitter transistor 26 is supplied with video signals via a network including a shunt resistor 42, a white level adjustment variable resistor 44, a resistive voltage divider 46, 54, 56 (the latter serving as a black level adjustment) and shunting capacitors 48, 58 arranged as shown.

A relatively low direct bias voltage (e.g., of the order of +12 volts) is coupled to the base of common base transistor 28. An active load circuit 30 is coupled to the collector of common base transistor 28 and comprises a third transistor 32 arranged as an emitter follower, a "disconnect" diode 34 coupled between the emitter of follower 32 and the collector of transistor 28, a crossover compensation diode 36 coupled between the base of follower transistor 32 and the collector of transistor 28, a bias resistor 40 coupled between a relatively high voltage supply (e.g., +210 volts) and the base of follower transistor 32 and a current limiting resistor 38 coupled between the collector of transistor 32 and the voltage supply (+210 v).

Voltage dependent current feedback is provided from the output of amplifier 14 (i.e., the emitter of follower transistor 32) to the base of common emitter transistor 26 via a resistor 52. Signals are coupled to the cathode 20 of the red electron gun of cathode ray tube 22 via a series resistor 60.

In the following discussion of the operation of the illustrated video amplifier, it will be assumed that resistor 56 is adjusted so that a "black level" (quiescent) voltage of 150 volts is provided at the emitter of load transistor 32. In that case, with the component values shown in the drawing, a quiescent current of 2.5 milliamperes will be established in resistor 40, diode 36 and transistors 28 and 26. A quiescent emitter current of approximately 3 milliamperes will also be established in load transistor 32. The latter current flows in feedback resistor 52 and establishes base bias for transistor 26. In the quiescent state, diode 36 and the base-emitter junction of load transistor 32 are each forward biased so that the cathode and anode of diode 34 are each at the same voltage. Diode 34 is therefore non-conducting in the absence of signals.

The quiescent current in the cascode transistors 26, 28 is determined principally by the value of resistor 40, while the quiescent current in load transistor 32 is determined principally by the value of feedback resistor 52. The voltage gain of the amplifier 14 is determined principally by the ratio of resistor 52 to the series combination of resistors 44 and 46. Resistor 44 provides a means for adjusting white level (or signal gain). Resistor 56 provides a means of adjusting black level (the quiescent voltage output at the emitter of transistor 32). The cathode 20 of cathode ray tube 22 may be considered to be a capacitive load at the emitter of transistor 32 of the order of 12 picofarads relative to ground potential.

In operation, when a negative-going signal voltage transition is provided across resistor 42, resistors 44 and 46 convert such signal to a decrease in base current of transistor 26. Therefore, the current through cascode transistors 26, 28, diode 36 and resistor 40 is reduced relatively rapidly from its quiescent value (2.5 milliamperes, as noted above). The collector voltage of transistor 28, as well as the base voltage of transistor 32, will rise at a rate which is relatively independent of the capacitive load of the cathode ray tube 22, that capacitive load being decoupled from the collector of transistor 28 by diode 34 and appearing at the base of transistor 32 reduced in value by the current gain (e.g., $\beta \approx 40$) of transistor 32. The initial rate of voltage rise at the base of transistor 32 therefore will be determined not by the picture tube load capacitance but rather by the time constant associated with resistor 40 and the capacitances at the collector of transistor 28 and the base of transistor 32 (which, as will appear below, may be made relatively small).

The output voltage across the load capacitance does not immediately change in response to negative-going input signal changes, since diode 34 is not conducting. However, when the collector voltage of transistor 28, and therefore the base voltage of transistor 32, has risen by approximately 0.7 volts, load transistor 32 conducts heavily and the load capacitance of the cathode ray tube electrode 20 is charged up via the low impedance voltage source which the emitter of transistor 32 represents. Transistor 32 therefore provides a high slew rate for large negative-going input signal transitions although quiescent current is relatively low. The voltage dependent current feedback via resistor 52 aids in reducing crossover distortion (i.e., the delay in the start of the rise of the output voltage).

When a positive-going signal voltage transition is provided across resistor 42, cascode transistors 26, 28 are driven into conduction levels greater than the quiescent level, thereby causing the collector voltage of transistor 28 to drop. Diode 34 turns fully on when this voltage drop reaches about 0.7 volts and provides a low impedance discharge path from the load capacitance (cathode 20) through diode 34 and cascode amplifier 24 to reference potential. This low impedance discharge path provides the desired high slew rate for large positive-going input signal voltage transitions.

The small signal behavior of the circuit provides relatively wide bandwidth as well. Since the common emitter transistor 26 need only sustain a relatively low reverse breakdown voltage and dissipates only a small amount of power as a result of its low collector voltage, a small signal device readily may be selected to provide the desired bandwidth. Since the cascode amplifier arrangement 24 reduces the Miller capacitance effect to a practical minimum and the active load circuit 30 reduces the effect of output load capacitance by a factor equal to the current gain of transistor 32, the output load R-C time constant is advantageously lowered. A relatively large value therefore may be selected for resistor 40 (the resistive component of the R-C output load time constant) to provide a desired reduction in quiescent operating current while still providing the required wide bandwidth. Differential temperature drift of the operating points of the three amplifiers 14, 16, 18 resulting from dissimilar signal levels in the three amplifiers is reduced substantially, since only the common emitter transistors (e.g., 26) contribute to temperature drift of each stage. The power dissipation and its rate of change in such common emitter transistors is small due to their small collector-emitter voltage.

The small signal common emitter transistor also exhibits a relatively high current amplification factor, and thereby cross-over distortion and variations in output voltage as a function of supply voltage are low in the illustrated arrangement.

Video transistors exhibiting a small collector-base feedback capacitance (e.g., less than 2.5 picofarads) which have been found suitable for the illustrated load transistor 32 include the types BFR 88, BF 391 or RCA types RCP 111C and BF 458. Suitable types for the common base transistor 28 include RCA types RCP 111C and BF 458. A suitable type for the small signal transistor 26 is the type BC 147.

With the component values shown in the FIGURE, practical idling power losses associated with transistors 28 and 32, were found to be less than 410 milliwatts and less than 220 milliwatts, respectively. The total idle power consumption for each of video amplifiers 14, with no signal input and the previously stated condition of 150 volts black level at the emitter of transistor 32, was found to be approximately 1.2 watts. With step input signals applied, rise and fall times of less than 130 nanoseconds and a frequency response which was down 2.6 db at 4 Megahertz were measured at the output.

Such apparatus was therefore found to be suitable for operation without the need for heat sinks for the active devices and without the need for peaking coils to improve the frequency response.

What is claimed is:

1. A video amplifier adapted to drive a color image reproducing device comprising:

first and second semiconductor devices arranged in a cascode amplifier configuration, said cascode amplifier having a signal current input terminal associated with said first device and a signal current output terminal associated with said second device, said first device being arranged in a current amplifying configuration and exhibiting a relatively high current amplification factor for video signal frequencies;

a source of video signal current coupled to said input terminal;

a source of direct operating voltage having first and second terminals;

a load impedance comprising a first diode and a third semiconductor device having a control electrode and a main current conduction path, said current conduction path and said diode being coupled in series relation between said first and said output terminals;

voltage dependent current feedback means direct current coupled between said output terminal and said current input terminal of said current amplifying device for providing degenerative feedback for said cascode amplifier; and biasing means comprising at least a first direct current path coupled between said first terminal and said control electrode for supplying bias current to said control electrode and direct current coupling means coupled between said control electrode and said output terminal for coupling quiescent current to said cascode amplifier, said biasing means being arranged such that said first diode is based to a substantially non-conductive condition in the quiescent mode.

2. A video amplifier according to claim 1 wherein:
said first direct current path comprises a resistor selected to provide a relatively low quiescent operating current to said cascode amplifier.

3. A video amplifier according to claim 2 wherein:
said first, second and third semiconductor devices are like conductivity transistors having collector-emitter circuits coupled in series relation across said operating voltage source.

4. A video amplifier according to claim 3 wherein:
said first transistor has a relatively low breakdown voltage rating and said second transistor has a relatively high breakdown voltage rating, said second transistor being arranged in a common base configuration with the base thereof coupled to a direct operating voltage which is a fraction of the voltage of said source.

5. A video amplifier according to claim 4 wherein:
said direct current coupling means coupled between said control electrode and said output terminal comprises a second diode biased to conduction in the quiescent mode.

6. A video amplifier according to claim 5 wherein:
said feedback means comprises a second resistor coupled between said output terminal and a base electrode of said first transistor and a first variable resistor coupled between said base electrode and said second terminal for adjusting the quiescent voltage at said output terminal.

* * * * *

UNITED STATES PATENT AND TRADEMARK OFFICE
CERTIFICATE OF CORRECTION

PATENT NO. : 4,096,517

DATED : June 20, 1978

INVENTOR(S) : WERNER HINN

It is certified that error appears in the above-identified patent and that said Letters Patent is hereby corrected as shown below:

In the Abstract, line 12, "based" should read -- biased --.

Column 1, line 17, "collected" should read -- collector --.

Column 5, line 10, "based" should read -- biased --.

Signed and Sealed this

Eighth Day of May 1979

[SEAL]

Attest:

RUTH C. MASON
Attesting Officer

DONALD W. BANNER
Commissioner of Patents and Trademarks